(12) United States Patent
Jimbo et al.

(10) Patent No.: US 6,828,645 B2
(45) Date of Patent: Dec. 7, 2004

(54) VOLTAGE WITHSTANDING STRUCTURE FOR A SEMICONDUCTOR DEVICE

(75) Inventors: Shinichi Jimbo, Kanagawa (JP); Jun Saito, Kanagawa (JP); Tomoyuki Yamazaki, Kanagawa (JP)

(73) Assignee: Fuji Electric Co., Ltd., Kanagawa (JP)

( * ) Notice: Subject to any disclaimer, the term of this patent is extended or adjusted under 35 U.S.C. 154(b) by 0 days.

(21) Appl. No.: 10/460,135

(22) Filed: Jun. 12, 2003

(65) Prior Publication Data

US 2003/0209774 A1 Nov. 13, 2003

Related U.S. Application Data

(62) Division of application No. 09/494,995, filed on Jan. 31, 2000, now Pat. No. 6,603,185.

(30) Foreign Application Priority Data

Feb. 1, 1999 (JP) .......................................... 11-023852
Oct. 29, 1999 (JP) .......................................... 11-308516

(51) Int. Cl.$^7$ ................................................ H01L 23/58
(52) U.S. Cl. ........................ 257/488; 257/492; 257/493; 257/495
(58) Field of Search ................................ 257/104, 106, 257/337, 341, 487, 488, 489, 490, 491, 492, 493, 494, 495, 603

(56) References Cited

FOREIGN PATENT DOCUMENTS

EP            0 576 001 A1    12/1993    ................. 257/489

*Primary Examiner*—Steven Loke
(74) *Attorney, Agent, or Firm*—Pearne & Gordon LLP

(57) ABSTRACT

A semiconductor device comprising: a semiconductor substrate, a dielectric film formed on the semiconductor substrate, a first electrode and a second electrode separated from each other on the dielectric film; a spiral thin film layer having both ends connected to the first electrode and the second electrode, respectively, the spiral thin film layer surrounding the first electrode, the thin film layer being formed on the dielectric layer, and a plurality of p-n diodes formed in series in the spiral thin film layer along a longitudinal direction of the spiral thin film layer.

5 Claims, 10 Drawing Sheets

DISTANCE FROM HIGH POTENTIAL SIDE
ELECTRODE TO LOW POTENTIAL SIDE ELECTRODE
(ON LINE A-A)

VOLTAGE WITHSTANDING STRUCTURE FOR A SEMICONDUCTOR DEVICE

This application is a divisional application of application Ser. No. 09/494,995, filed on Jan. 31, 2000, now U.S. Pat. No. 6,603,185.

BACKGROUND OF THE INVENTION

1. Field of the Invention

This invention relates to a planar horizontal type and a planar vertical type semiconductor device, and particularly to a voltage withstanding structure therefor.

2. Description of the Related Art

Power devices represented by a bipolar transistor, a power MOSFET and IGBT (Insulated Gate Bipolar Transistor) requires a voltage withstanding structure (i.e. structure of an area having a withstand voltage) of several tens to several thousands volts. In order to drive these power devices, in recent years, many attempts have been made to develop a high withstand voltage IC. The high withstand voltage IC also requires a withstand voltage substantially equal to the requirement for the power device.

FIGS. 10A and 10B show a composite structure of a Double RESURF structure and a resistive field plate structure. FIG. 10A is a sectional view of the main portion thereof and FIG. 10B is a graph of a potential distribution thereof. This voltage withstanding structure is a typical high withstand voltage IC.

As seen from FIG. 10A, an N-well region 34 is formed in a surface layer of a p-type substrate 35. In a surface layer of this N-well region 34, a high potential region 33, a low potential region 37 and P-offset region 39 are formed. On the high potential region 33 and low potential region 37, a high potential side electrode 32 and a low potential side electrode 38 are formed, respectively. On the dielectric oxide film 41 formed on the p-type substrate 35, a thin film resistive layer 40 is formed which is a resistive field plate having high resistivity. This thin film resistive layer 40 makes an electric contact between the high potential side electrode 32 and low potential side electrode 38. The low potential side electrode 38 is electrically connected to the electrode 36 on the rear side at an end portion of the p-type substrate 35. Reference numeral 35a denotes a p-type substrate layer.

FIG. 10B shows the state of the potential distribution on the chip surface when a high potential Vs is applied to the high potential side electrode 32 with respect to the low potential side electrode 38 (e.g. GND).

The potential distribution has a great distortion at the vicinity of both ends of the resistive field plate 40 where an electric field is concentrated. Accordingly, the withstand voltage is lowered at these portions.

FIG. 11 is a view showing the enlargement of a depletion layer within a semiconductor. The sectional view of the main portion of a semiconductor device shown in FIG. 11 is the same as that shown in FIG. 10A. Therefore, reference numerals in FIG. 11 refer to the same as the reference numerals in FIG. 10A.

In FIG. 11, when the a positive potential Vs is applied to the high potential side electrode 32 with respect to the low potential side electrode 38 and the rear side electrode 36, depletion layers 47 and 48 expand from two p-n junctions which are reverse-biased.

One p-n junction is formed between the N-well region 34 and P-offset region 39 or low potential region 37, and another p-n junction is formed between the N-well region 34 and p-type substrate layer 35a.

Generally, because of influence of fixed charge at the boundary between the dielectric oxide film 41 and semiconductor, an electric field is liable to concentrate within the depletion layer on the semiconductor surface, which leads to breakdown of the device.

In the resistive field plate structure, when a potential Vs is applied to the high potential side electrode 32, the potential Vs is also applied to the thin film resistive layer 40 so that a current corresponding to the potential Vs and the resistance of the thin film resistive layer 40 flows through the thin film resistive layer 40. Thus, if a uniform potential distribution is generated in the thin film resistive layer 40, the electric field due to this potential distribution affects the semiconductor layer so that the concentration of the electric field within the depletion layer on the surface of the semiconductor layer can be relaxed. This assures the high withstand voltage stably.

In the conventional structure, in order that a large leak current is not generated between the high potential region 33 and low potential region 37, as the thin film resistive layer 40 which is a field plate, a layer having high resistivity of several MΩ cm, e.g. of non-doped amorphous silicon or oxygen-doped polysilicon (SIPOS) has been adopted.

However, in order to form the high-resistivity layer of several MΩ cm surely, the impurities invading this layer have to be restricted to a very small quantity, thereby making it difficult to manufacture the device. The value of the resistivity is likely to vary according to positions.

Where the resistance of the thin film resistive layer 40 is low, the variation of the resistance is small. However, because a large leak current flows, a large loss occurs. This lead to breakdown of the device. On the other hand, the resistance of the thin film resistive layer 40 is too high, a variation of the resistance is generated so that the leak current is likely to flow non-uniformly. This makes it difficult to form a uniform electric potential distribution between the high potential region 33 and low potential region 37. This produces an area where the electric field concentrates within the depletion layer of the semiconductor layer. Because of this, a withstand voltage may be lowered.

A proposal for solving these problems is disclosed in JP-A-4-332173 in which, as shown in FIG. 12, the resistance of the thin film resistive layer 40 is reduced to restrict its variation, and the thin film resistive layer 40 is formed in a spiral shape between an island base electrode 43 (high potential side electrode) and a peripheral electrode 44 (low potential side electrode) encircling it so that this long thin film resistive layer (spiral thin film resistive layer 45) connects the base electrode 43 to the peripheral electrode 44, thereby increasing the resistance.

In this structure, the resistivity of the spiral thin film resistive layer 45 is reduced to restrict its variation, and the resistance from end to end of the spiral thin film resistive layer 45 is increased to suppress the leak current. The potential distribution on the segment connecting the base electrode 43 and peripheral electrode 44 in line changes stepwise by the number of times of spiral winding of the spiral thin film resistive layer 45. An increase of the number of times of winding decreases a drop between the steps, thereby making the average potential gradient constant.

The structure described above realizes, as a lower value, the resistivity of the spiral resistive layer 45 electrically connecting the peripheral electrode 44 and base electrode 43 than that of the resistive field plate having the conventional structure. This structure has an advantage of capable of easily controlling the resistivity as compared with the case of the field plate.

However, an increase in the chip size of a semiconductor device when the spiral thin film resistive layer 45 is formed lengthens the length of the spiral thin film resistive layer 45 so that its resistance becomes large. In order to cause the equal leak current to flow irrespectively of the chip size, when the chip size is increased, the width of the spiral thin film resistive layer 45 must be extended. This necessarily increases the width of the voltage withstanding structure arranged in the periphery. Therefore, with the semiconductor device having the same withstand voltage, the width of the voltage withstanding structure must be changed according to its current capacity, i.e. area of an active region. This is inconvenient in production cost when the semiconductor devices in the same withstand voltage series are produced.

Although the value of the resistivity of the thin film adopted as the spiral thin film resistive layer has become settable as a relatively low value, it is still difficult to provide uniform resistivity along the spiral resistive layer. Therefore, the resistance of the spiral thin film resistive layer 45 varies according to its position, and the electric field concentrates locally in the voltage withstanding structure, thereby reducing the device withstand voltage. The resistance greatly varies due to temperature. Accordingly, it is also difficult from the standpoint of assuring reliability to use the spiral resistive layer for a device.

U.S. Pat. No. 5,475,258 proposes to form a Zener diode on a dielectric film between the gate and drain of a power MOSFET. However, this is not sufficient to make uniform the potential distribution between the source and drain.

U.S. Pat. No. 5,729,044 proposes to connect p-type regions and n-type regions formed within a semiconductor substrate by metal to form diodes in series. However, it is difficult to combine this structure with the RESURF structure which has been widely applied in a horizontal type device. Therefore, this structure is not suitable to the horizontal type device.

U.S. Pat. No. 5,382,825 proposes, for a vertical type device, to connect a large number of diodes in series and spirally in an inactive region on the periphery of an active region. However, this reference is silent on arranging such a structure for the horizontal type device and also on the active region. In addition, the number of the diodes connected in series and spirally is selected to define a device in the rated voltage. Therefore, when the voltage in the vicinity of the rated voltage is applied to the device, a large leak current flows disadvantageously.

As understood from the above description, a voltage withstanding structure has not been proposed which can be applied to both horizontal and vertical, formed in a structure composed of a large number of diodes which operates like a field plate, produces a small leak current and can make the potential distribution sufficiently uniform.

SUMMARY OF THE INVENTION

An object of this invention is to solve the above problems to provide a horizontal type and a vertical type semiconductor device having a voltage withstanding structure which is difficult to produce concentration of an electric field and has great reliability.

In order to attain the above object, there is provided a semiconductor device comprising:

a first electrode and a second electrode separated from each other on a dielectric film formed on a semiconductor substrate;

a spiral thin film layer having both ends connected to the first electrode and the second electrode, respectively and surrounding the first electrode, the thin film layer being formed on the dielectric layer; and a plurality of p-n diodes formed in series formed in a longitudinal direction of the spiral thin film layer.

The semiconductor substrate located between the first electrode and the second electrode constitutes an active region through which a main current flows, and the spiral thin film layer is formed above the semiconductor substrate through the dielectric film.

The spiral thin film layer is made of polysilicon, and first conduction type regions and second conduction type regions are formed alternately in the polysilicon so that these regions constitute p-n junctions.

The spiral thin film layer is made of first conduction type polysilicon, and a plurality of second conduction type are formed selectively at intervals in the first conduction type polysilicon so that the first conduction type regions of the first conduction type polysilicon and the second conduction type regions are alternately formed and constitute p-n junctions.

The p-n diodes are formed in a forward series connection or a reverse series connection within the spiral thin film layer.

Each of the p-n diodes is preferably a Zener diode.

The impurity concentration in each of the first conduction type regions and second conduction type regions is preferably $1 \times 10^{18}$ cm$^{-3}$ or higher.

The first conduction type polysilicon is preferably doped with p-type or n-type impurities with a concentration of $1 \times 10^{18}$ cm$^{-3}$ or higher.

The dielectric film preferably has a thickness of 0.01 to 10 $\mu$m.

Preferably, the semiconductor substrate is of the first conduction type;

a first region having a first conduction type and a second region having a second conduction type are formed apart from each other in an surface layer of the semiconductor substrate;

a third region having the second conduction type is formed in the surface layer of the semiconductor substrate between the first region and the second region so that it is apart from the first region and abuts on the second region; and the first region is connected to the first electrode, and the second region is connected to the second electrode.

Preferably, the semiconductor substrate is of the first conduction type;

a first region and a second region having a second conduction type, respectively are formed apart from each other in a surface layer of the semiconductor substrate;

a third region having the second conduction type is formed in a ring-shape in the surface layer of the semiconductor substrate between the first region and the second region so that it surrounds the first region; and the first region is connected to the first electrode, and the second region is connected to the second electrode.

Preferably, assuming that the withstand voltage of the semiconductor device is $V_B$, the breakdown voltage of each of the p-n diodes is Vz, and the number of p-n junctions constituting the p-n diodes in the spiral thin film layer and placed in a reverse blocked state is, $V_B < V_Z \times m$ As described above, for example, a plurality of p type regions are formed at intervals in an n type polysilicon so that n type regions and p-type regions are formed alternately.

These p type regions and n type regions constitute p-n diodes, respectively. Thus, a structure composed of p1, n1, p2, n2, . . . constitutes the thin film layer. The first pair of p1 and n1 constitutes a first p-n diode, second pair of n1 and p2 constitute a second p-n diode, and third pair of p2 and n2 constitute a third p-n diode. Therefore, the first p-n diode and second p-n diode are connected in reverse-series, and the second p-n diode and third p-n diode are also connected in reverse-series. In short, the thin film layer has a structure in which a plurality of pairs of p-n diodes connected in reverse-series are connected in series.

Where the regions of n1 and p2 are connected by a metallic film, the p-n diodes composed of p1 and n1 and of p2 and n2 are connected in a forward-series. In this case, the thin film layer has a structure in which a plurality of p-n diodes are connected in the forward-series.

In order that these p-n diodes serve as Zener diodes, non-doped polysilicon is doped with first conduction type impurities with a concentration of $1 \times 10^{18}$ cm$^{-3}$ or higher to form first conduction type polysilicon. The second conduction type regions with an impurity concentration of $1 \times 10^{18}$ cm$^{-3}$ or higher are formed in the first conduction type polysilicon to form Zener diodes. It is estimated that within a range of the impurity concentration of $10^{18}$ cm$^{-3}$ to $10^{19}$ cm$^{-3}$, an avalanche breakdown and Zener breakdown occur mixedly and with the impurity concentration of $10^{19}$ cm$^{-3}$ or higher, the Zener breakdown occurs dominantly.

By connecting the Zener diodes in series (reverse-series or forward-series) to constitute the spiral thin film layer, a uniform potential distribution can be obtained on the line segment coupling the first electrode and second electrode, thereby preventing the electric field from being concentrated.

FIG. 5 is a graph showing the voltage/current characteristic of the Zener diode made of polysilicon. In a reverse-biased region, when the reverse voltage for the p-n junction is increased, a breakdown phenomenon that a current flows abruptly at a prescribed voltage (Zener voltage: Vz) appears. In the spiral thin film layer composed of the Zener diodes, when a voltage Vs is applied to the high potential side electrode with respect to the low potential side electrode, the reverse-blocked state of the Zener diode is placed in a non-breakdown state or breakdown state according to the value of Vs.

Assuming that the Zener voltage of the individual Zener diode is Vz, and the number of p-n junctions constituting the p-n diodes in the spiral thin film layer and placed in a reverse blocked state is m,
(1) when Vs<m·Vz (Zener diode is in the non-breakdown state), the leak current Is in the reverse direction of the p-n junction flows through the spiral thin film layer.
The individual Zener diode formed in the highly impurity doped polysilicon provides a leak current Is and a uniform voltage/current characteristic. Therefore, the spiral thin film layer can provide the uniform potential distribution along the spire. By increasing the impurity concentration, the concentration can be easily controlled, thereby reducing a variation in the concentration within a plane and hence in the resistance.
(2) When Vs≧m·Vz (Zener diode is in the breakdown state), an excessive current flows in a reverse direction of the pn junction. If this state continues for a long time, the spiral thin film layer generates heat and will be broken.

If the number of the Zener diodes is increased so that the sum of the Zener voltages of all the Zener diodes formed in the spiral thin film is higher than a desired withstand voltage of the semiconductor device, the non-breakdown state of the above item (1) can be used. By operating the Zener diodes in this non-breakdown state, the potential distribution of the spiral thin film layer can be made uniform without breaking the Zener diodes. The leak current flowing through the spiral thin film layer depends on the voltage/current characteristic when the Zener diode is reverse-blocked, but not greatly depend on the length of the spiral thin film layer if the number of the Zener diodes is not changed. The change in the leak current due to a temperature change is much smaller than the conventional highly resistive spiral layer, thereby forming a stable potential distribution.

Each of FIGS. 6A to 6C shows the distribution of an electric field along a spiral thin film layer. FIG. 6A is a schematic view of the distribution of an electric field, FIG. 6B is an enlarged view of FIG. 6A and a schematic view of a spiral thin film layer, and FIG. 6C is a graph showing the potential distribution.

As seen from FIGS. 6A and 6B, the electric field becomes Emax at the p-n junctions formed in the spiral thin film layer, whereas at the position to which the depletion layer is not expanded, it becomes Emin. Although there is a small electric field at the areas where the p-n junction is forward-biased, it is not illustrated. Emin refers to the electric field produced by a voltage drop due to the leak current at the position to which the depletion layer is not expanded.

As seen from FIG. 6C, the potential along the spiral thin film layer has a constant gradient from Vs to GND, thereby providing an ideal potential distribution as shown in FIG. 10B. When the potential distribution is scaled up, it falls stepwise. However, because of presence of a large number of Zener diodes, the step is very small.

Where a plurality of thin film layers are formed, even if one of them is blown out, the remaining thin film layer can make the potential distribution uniform.

DESCRIPTION OF THE PRESENT INVENTION

The present invention will be described in detail with reference to the accompanying drawings.

Figure 1A:
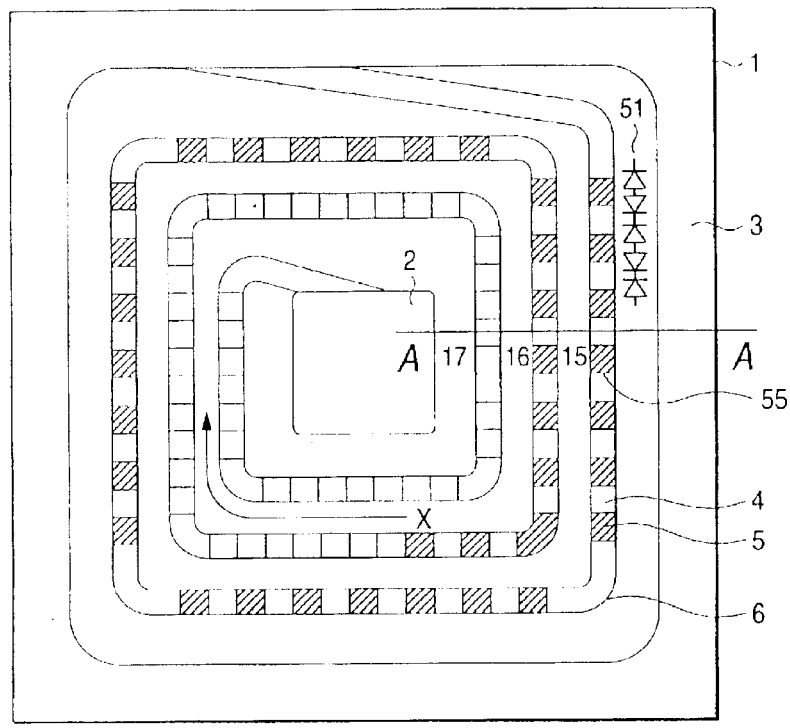
FIG. 1A is a plan view showing a main part of a voltage withstanding structure of a semiconductor device according to a first embodiment and a fourth embodiment of the invention.

FIG. 1A is a plan view showing a main part of a voltage withstanding structure of a semiconductor device according to a first embodiment of the invention.

Figure 1B:
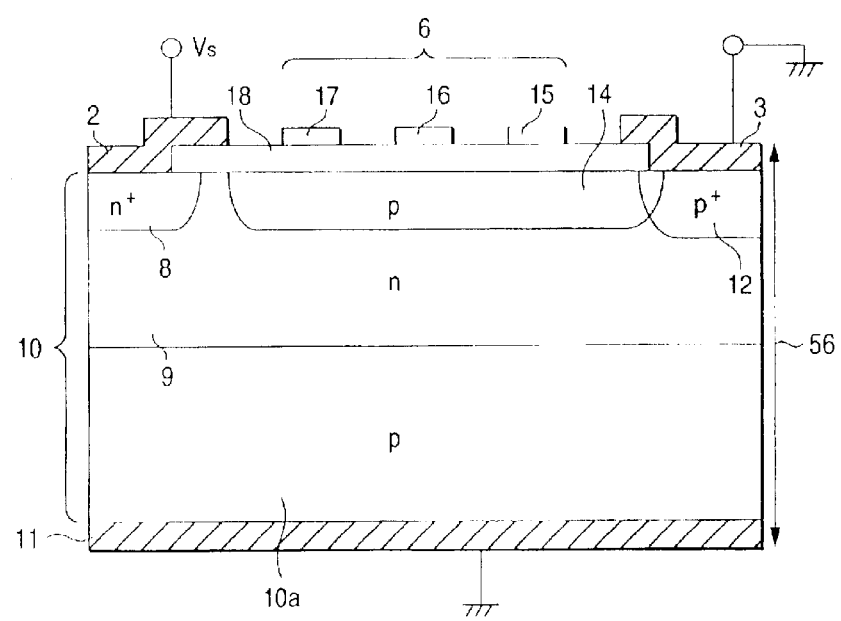
FIG. 1B is a sectional view of the main part taken in line A—A in FIG. 1A.

FIG. 1B is a sectional view of the main part taken in line A—A in FIG. 1A.

The effect of a spiral thin film layer 6 is the same in both cases where a high potential is applied to an inner island electrode with respect to an outer electrode (GND), and in contrast, the high potential is applied to the outer electrode. In the first embodiment, the former case is selected.

As seen from FIG. 1A, a planar semiconductor device 1 has a high potential side electrode 2 located at the center of the front surface, a low potential side electrode 3 located outside the electrode 2 and the spiral thin film layer 6 which is located between the electrodes 2 and 3 and turned around the high potential side electrode 2 three times so as to connect electrically the electrodes 2 and 3 to each other. The spiral thin film layer 6 is constructed of a repetition of a first conduction type thin film layer 4 and a second conduction type thin film layer 5.

As seen from FIG. 1B, an N-well layer 9 is formed in the surface layer of a p-type substrate 10. In the surface layer of the N-well layer 9, an n-type high potential region 8, a p-type low potential region 12 and a P-offset region 14 are formed. Further, on the front surface side of the p-type substrate, the spiral thin film layer 6 which is constructed of a repetition of the first conduction type thin film layer 4 and the second conduction type thin film layer 5 is formed through a dielectric oxide film 18. The areas of the spiral thin film layer 6 located on line A—A are indicated by 15, 16 and 17.

On the other hand, on the rear surface side of the p-type substrate 10, a rear surface side electrode 11 is formed. The low potential side electrode 3 is located at a chip end. A distortion layer is formed in a dicing plane 56 of the end. Since the voltage blocking capability is lost in the distortion layer, the low potential side electrode 3 and rear surface side electrodes 11 are electrically connected to each other and fallen in GND in potential. By making the entire exposed surface of the chip end as a p-type layer in addition to the dicing plane 56, a stronger electrical connection can be made between the low potential side electrode 3 and rear surface side electrode 11.

The spiral thin film layer 6 can be made in such a manner that a non-doped polysilicon is doped with impurities of the first conduction type and the second conduction type to form the first conduction type thin film layer (region) 4 and second conduction type thin film layer (region) 5 alternately. Otherwise, the first conduction type polysilicon is doped at intervals with the second conduction type impurities to form the first conduction type thin film layers 4 and second conduction type thin film layers 5 alternately. Reference numeral 51 denotes the inverted series connection state of p-n diodes where the first conduction type thin film layer 4 is an n-type layer and the second conduction type thin film layer 5 is a p-type layer. In FIG. 1A, a hollow portion refers to the first conduction type thin film layer 4 and a hatched portion refers to the second conduction type thin film layer 5. For simplicity of illustration, the hatched portions to be inserted alternately in a direction indicated by an arrow X are not shown.

In this structure, when a positive potential Vs is applied to the high potential side electrode 2 with respect to the low potential side electrode 3, the potential Vs is also applied to the end of the spiral thin film layer 6 which is connected to the high potential side electrode 2 so that a uniform potential distribution is formed in the spiral thin film layer.

Figure 2A:
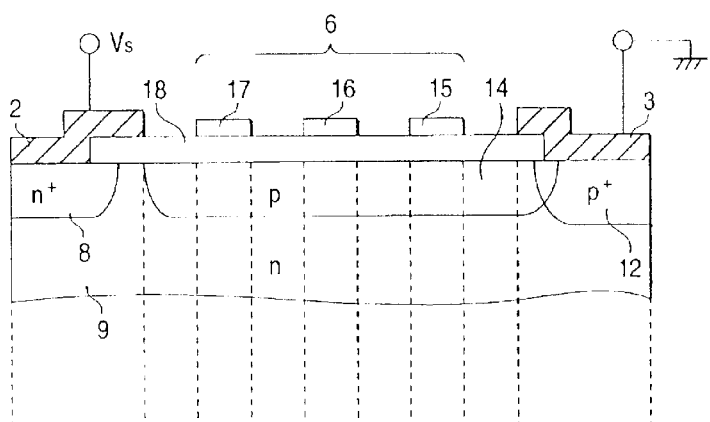
FIG. 2A is a sectional view of the semiconductor device.
Figure 2B:
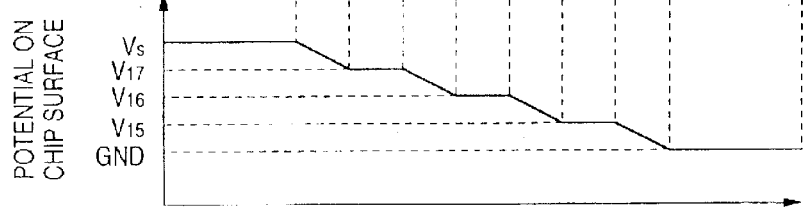
FIG. 2B is a graph showing the potential distribution of the chip surface.

FIG. 2A is a sectional view of the semiconductor device. FIG. 2B is a graph showing the potential distribution of the chip surface. The potential gradient is created on the surface of the P-offset layer.

FIG. 2A corresponds to the upper portion of FIG. 1B. FIG. 2B shows the potential distribution from the high potential side electrode 2 to the low potential side electrode 3 along line A—A in FIG. 1A. The respective areas of the spiral thin film layer 6 taken in line A—A are indicated by numerals 15, 16 and 17. The potentials applied to the spiral thin film layers (regions) 15, 16 and 17 are referred to as V15, V16 and V17, respectively. As seen, the potential from the high potential side electrode 2 to the low potential side electrode has a constant average gradient. Therefore, the electric field in the depletion layers created in the N-well layer 9, P-offset layer 14 and p-type substrate layer 10a (not shown) is relaxed so that the semiconductor device 1 can have a high withstand voltage.

Referring to FIG. 1A, the potential applied along the spiral thin film layer 6 will be explained.

Assuming that the semiconductor device 1 has a withstand voltage of e.g. 600 V, with respect to junctions 55 serving as Zener diodes, the number of the p-n junctions 55 in a reverse-blocked state is set at m=400, and the Zener voltage which is a breakdown voltage or withstand voltage of the junction diode is Vz=4 V for every diode. Thus, the whole voltage of the Zener diodes=4 V×400=1600 V. This gives a sufficient margin to the withstand voltage of 600 V of the semiconductor device 1 so that the Zener diodes will not be broken down. Therefore, the semiconductor device 1 will not be broken owing to heat generation. The voltage applied to a single Zener diode is as low as 600 V÷400=1.5 V. The potential lowers uniformly at the potential step of 1.5 V along the spiral thin film layer 6 from the high potential side electrode 2 to the low potential side electrode 3, thereby providing a uniform potential distribution.

Where the voltage Vz is set at 7 V, m is about 230 and the voltage applied to the single Zener diode is as low as about 2.6 V. Thus, the potential lowers uniformly at the potential step of 2.6 V along the spiral thin film layer 6 from the high potential side electrode 2 to the low potential side electrode 3, thereby providing a uniform potential distribution.

Since the concentration (concentrations of the first conduction type thin film layer and of the second conduction type thin film layer) of polysilicon constituting the Zener diodes is high, a variation in the voltage/current characteristic of the Zener diodes is small. In an actual measurement, the variation in the voltage shared by each Zener diode for a leak current is within 10%. The uniformity of the potential distribution along the spiral thin film layer can be also improved by increasing the concentration of polysilicon.

Thus, a stable potential distribution can be obtained along the spiral thin film layer 6 without breaking down the Zener diodes, thereby increasing the withstand voltage of the semiconductor device.

In the embodiment shown in FIGS. 1A and 1B, the spiral thin film layer 6 is turned three times around the inner high potential side electrode 2. However, the number of times of turn-around varies according to chip size and the-withstand voltage of the semiconductor 1. It should be noted that the larger number of times of turn-around is preferred because the uniformity of the potential distribution is improved on a line (e.g. line A—A) coupling the high potential side electrode 2 with the low potential side electrode 3 in line.

Although 400 Zener diodes was used in this embodiment, the number may be set so that the entire Zener voltage is not lower than the withstand voltage of the semiconductor device 1. The shape of the spiral thin film layer 6 may be changed according to that of the electrode (e.g. shape of the high potential side electrode 2) encircled thereby, and may be circular or polygonal. Further, although polysilicon was used as a material of the spiral thin film layer 6 in this embodiment, a semiconductor material such as single crystal silicon, GaAs and SiC may be adopted. Furthermore, although a single spiral line was adopted from the start to end of the thin film layer 6, a plurality of spiral lines may be provided therefor.

In the embodiment hitherto described, a large number of p-n diodes were connected in the inverted series manner. An explanation will be given of an embodiment in which a large number of p-n diodes are connected in a forward series manner.

Figure 3:
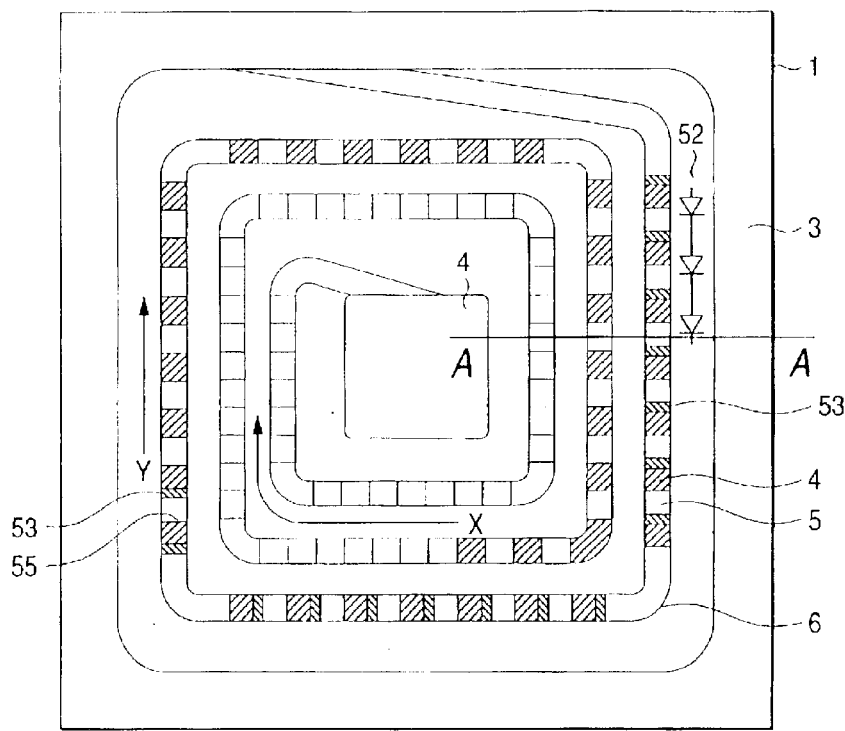
FIG. 3 is a plan view of a withstanding structure of a semiconductor device according to a second embodiment of the invention.

FIG. 3 is a plan view of the main part of the voltage withstanding structure of the semiconductor device according to the second embodiment of the invention. This embodiment is different from that shown in FIG. 1A in that the p-n junctions 55 formed in the spiral thin film layer 6 are alternately short-circuited by metallic films 53, and hence the p-n diodes serving as Zener diodes are connected in a forward-series manner. The metallic film 53 may be made of a material such as aluminum which is usually used for the electrode of a device. The metallic film 53 is formed on the p-n junction in a forward direction so that the p-n diode is placed in a reverse-blocked state as indicate by 52. Incidentally, although the metallic films 53 are arranged alternately with respect to the p-n junctions 55 in a direction of arrow Y, it is not shown.

In the first embodiment, the spiral thin film layer which is constructed of a repetition of Zener diodes according to the invention has been applied to the voltage withstanding structure of the horizontal type planar semiconductor device. However, it may be applied to the voltage withstanding structure of a vertical type planar semiconductor device in which a depletion layer expands horizontally from an active region of a chip. The embodiment in which the spiral thin film layer is applied to the vertical type semiconductor device.

Figure 4:
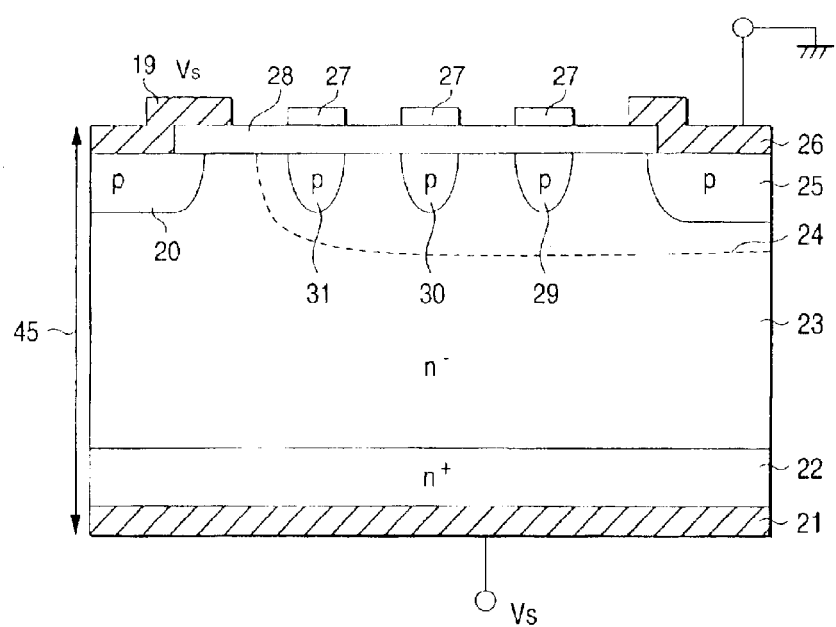
FIG. 4 is a plan view of a withstanding structure of a semiconductor device according to a third embodiment of the invention.
Figure 5:
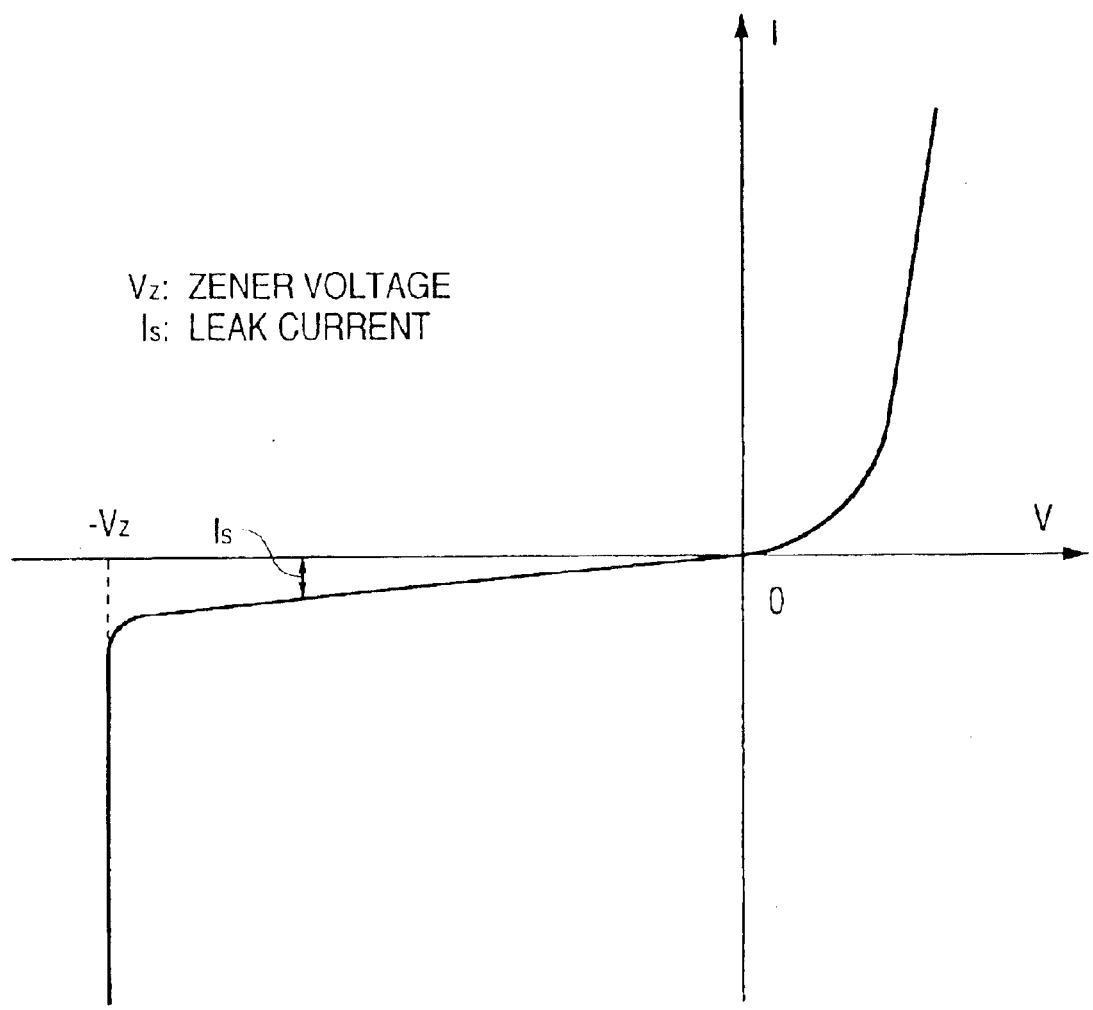
FIG. 5 is a graph showing the voltage/current of a Zener diode using polysilicon.
Figure 6A:
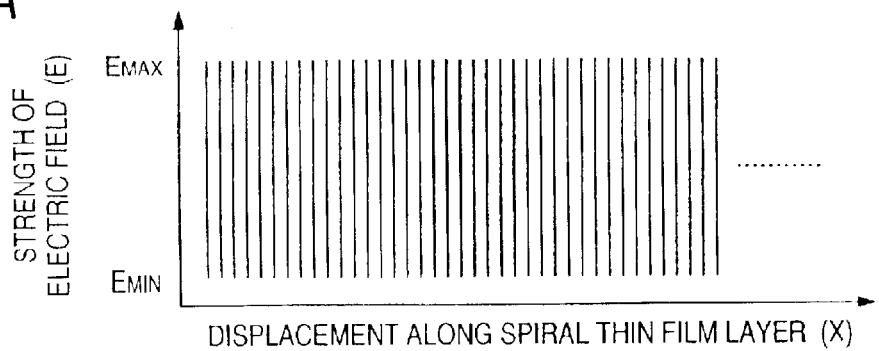
FIG. 6A is a schematic view of the distribution of an electric field along the spiral thin film layer.
Figure 6B:
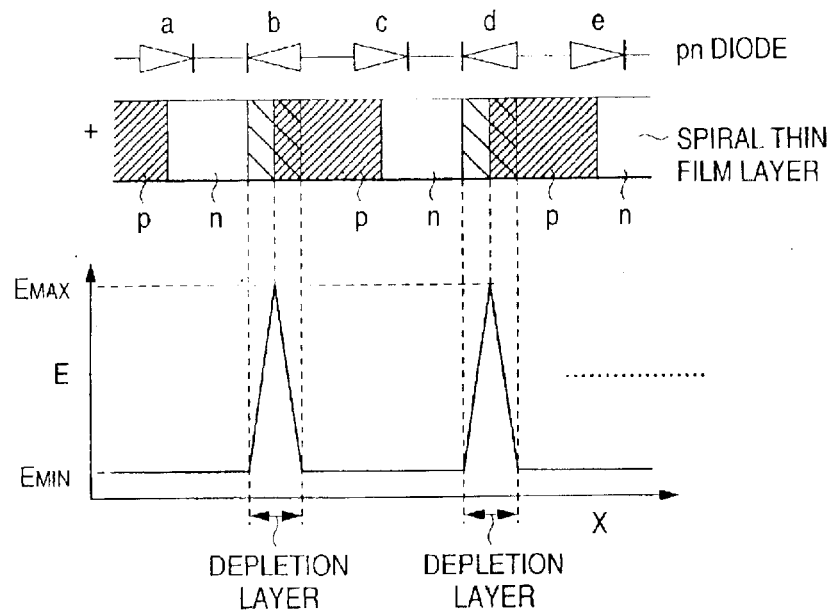
FIG. 6B is an enlarged view of FIG. 6A along the spiral thin film layer and a schematic view of a spiral thin film layer.
Figure 6C:
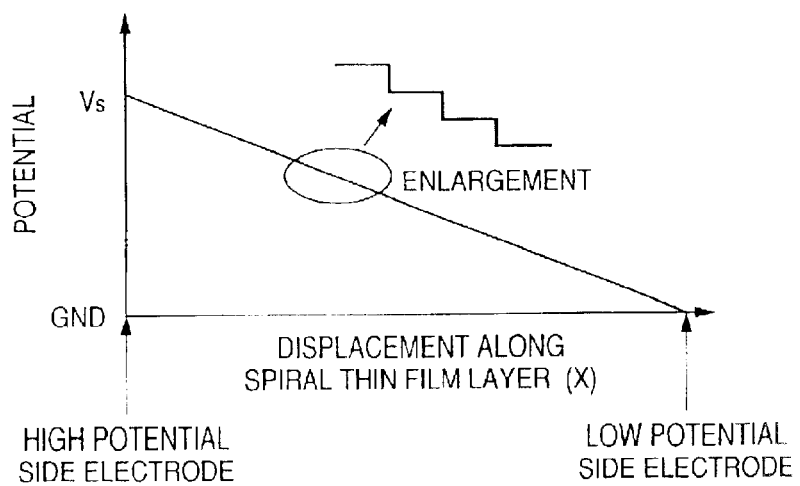
FIG. 6C is a graph showing the potential distribution along the spiral thin film layer.

FIG. 4 is a sectional view of the main part of a voltage withstanding structure in a semiconductor device according to the third embodiment of the invention.

As shown in FIG. 4, on the rear surface side of an n⁻ layer 23, an n⁺ layer 22 is formed. On the front surface side thereof, formed are a p-type well region which serves as a low potential region 25 and p-type regions 29, 30 and 31 which is formed to surround the low potential region and serve as guard rings. At the chip end, a p-type region which serves as a high potential region 20 is formed. In the p-type well which serves as the low potential region 25, an active region (occupied by a gate region and source region in an MOSFET) is formed. A low potential side electrode 26 is formed on the low potential region 25, a high potential side electrode 19 is formed on the high potential region 20, and a rear surface side electrode 21 is formed on the n⁺ layer on the rear surface side. The rear surface side electrode 21 and high potential side electrode 19 are electrically connected to each other on a dicing plane 45.

The p-type guard ring regions 29, 30 and 31 surround the p-type well region 25 in a ring shape. A spiral thin film 27 which connects the high potential side electrode 19 to the low potential side electrode 26 is formed through a dielectric oxide film 28 on a semiconductor substrate.

In such a structure, when a potential Vs is applied to the rear surface side electrode 21, the potential Vs is also applied between the high potential side electrode 19 and low potential side electrode 26. Then, a leak current flows through the spiral thin film 27 in a series connection of Zener diodes, thereby forming a potential distribution. This electric field due to the potential distribution uniformly expands the depletion layer 24 formed in the semiconductor substrate to relax the concentration of an electric field, thereby improving the withstand voltage of the semiconductor device.

In a fourth embodiment of the invention, each of the first conduction type layer and the second conduction type layer which constitute the spiral thin film layer in FIGS. 1A and 1B is doped with impurities at $1 \times 10^{18}$ cm$^{-3}$ or higher. By highly doping these layers in this way, the p-n diode constituted by the first and the second conduction type thin film layer serves as a Zener diode. Further, by highly doping these layers, the variation in the voltage/current characteristic of the Zener diode when it is reverse-blocked can be suppressed so that the a uniform potential gradient can be formed along the spiral thin film layer. Further, by forming a group of Zener diodes in the spiral thin film layer, the temperature dependency of the potential distribution can be reduced as compared with the conventional resistive thin film layer.

In the semiconductor device according to the fourth embodiment of the invention, the dielectric oxide film though which the spiral thin film layer is formed on the semiconductor substrate has a thickness of 0.01–10 μm. If it is thinner than 0.01 μm, the spiral thin film may be brought into contact with the semiconductor substrate because of a variation in the manufacturing condition. On the other hand, if it is thicker than 10 μm, manufacturing it takes a long time. In addition, it is too thick so that the potential of the spiral thin film layer cannot be effectively conducted to the surface of the semiconductor substrate. Such a thing is not preferable for the device structure and necessarily leads to an increase in the production cost.

As described above, the spiral thin film layer according to the invention has a structure in which the Zener diodes are arranged repeatedly. This structure is designed so that the product (m×Vz) of the number m of the diodes in a reverse-blocked state and the Zener voltage Vz of each Zener diode is sufficiently larger than the withstand voltage of the semiconductor device. In this structure, when a voltage lower than the withstand voltage is applied between the high potential side electrode and the low potential electrode, a leak current Is in a reverse direction of the diodes flows through the spiral thin film, thereby forming a uniform potential distribution along the thin film layer. This moves carriers in the first conduction type thin film layer or second conduction type thin film layer so that the depletion layer is expanded to relax the concentration of an electric field, thereby improving the withstand voltage of the semiconductor device.]

By optimizing the impurity concentration of the first conduction type or second conduction type, number of the Zener diodes and material of the thin film layer, the invention can greatly reduce a variation of the leak current due to the size (width and length) of the thin film layer and a temperature change, thereby providing a stable withstand voltage as compared with the conventional field plate or spiral resistive layer.

Figure 7:
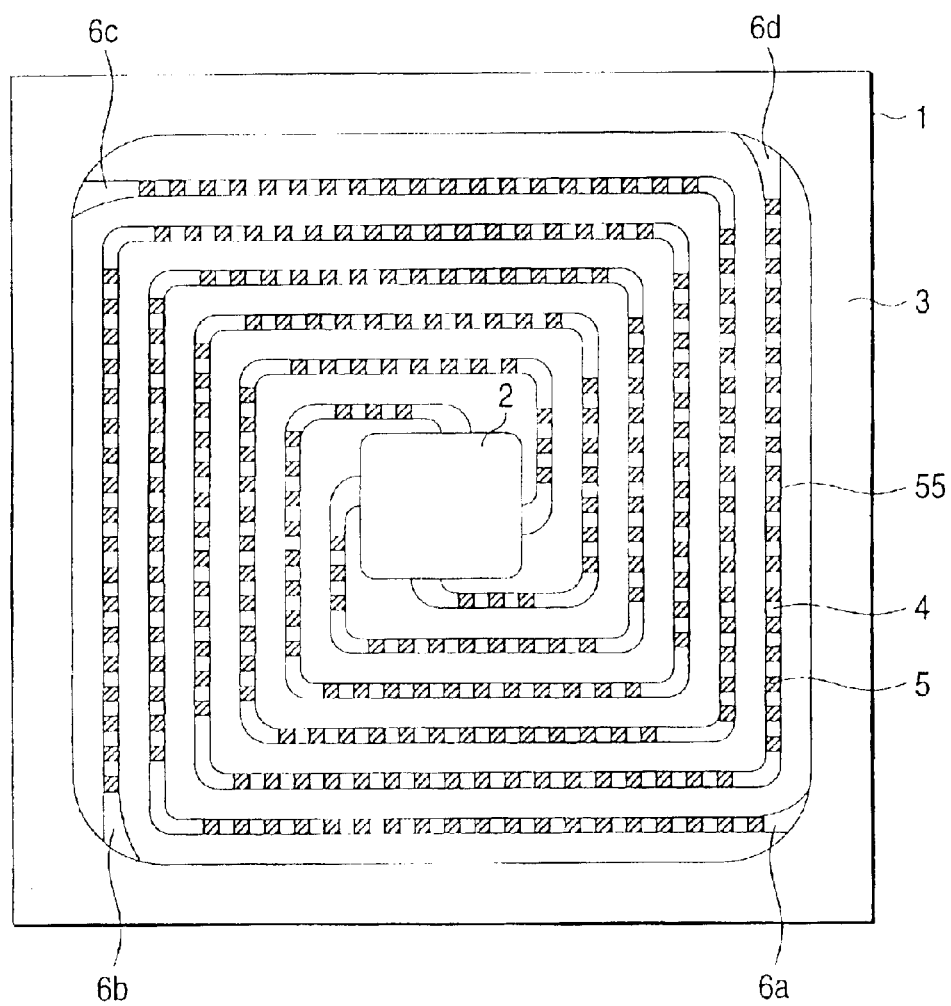
FIG. 7 is a plan view of the main part of a voltage withstanding structure according to a fifth embodiment of the invention.

FIG. 7 is a plan view of the main part of a voltage withstanding structure in the semiconductor device according to the fifth embodiment of the invention.

Four thin film layers are wound spirally, respectively. Each spiral thin film layer is composed of first conduction type thin film layers (areas) and second conduction type thin film layers (areas). This embodiment is different from the first embodiment shown in FIG. 1A in that a plurality of spiral thin film layers (first, second, third and fourth spiral thin film layer 6a, 6b, 6c and 6d) are formed. Since the plurality of thin film layers are formed, even when any single thin film layer is cut, the other good thin film layer makes the potential distribution uniform, thereby improving reliability of the device withstand voltage.

The semiconductor device according to the fifth embodiment of the invention has the same section of its main part and the same potential distribution on the chip surface as those in FIGS. 2A and 2B, which are not explained here.

Figure 8:
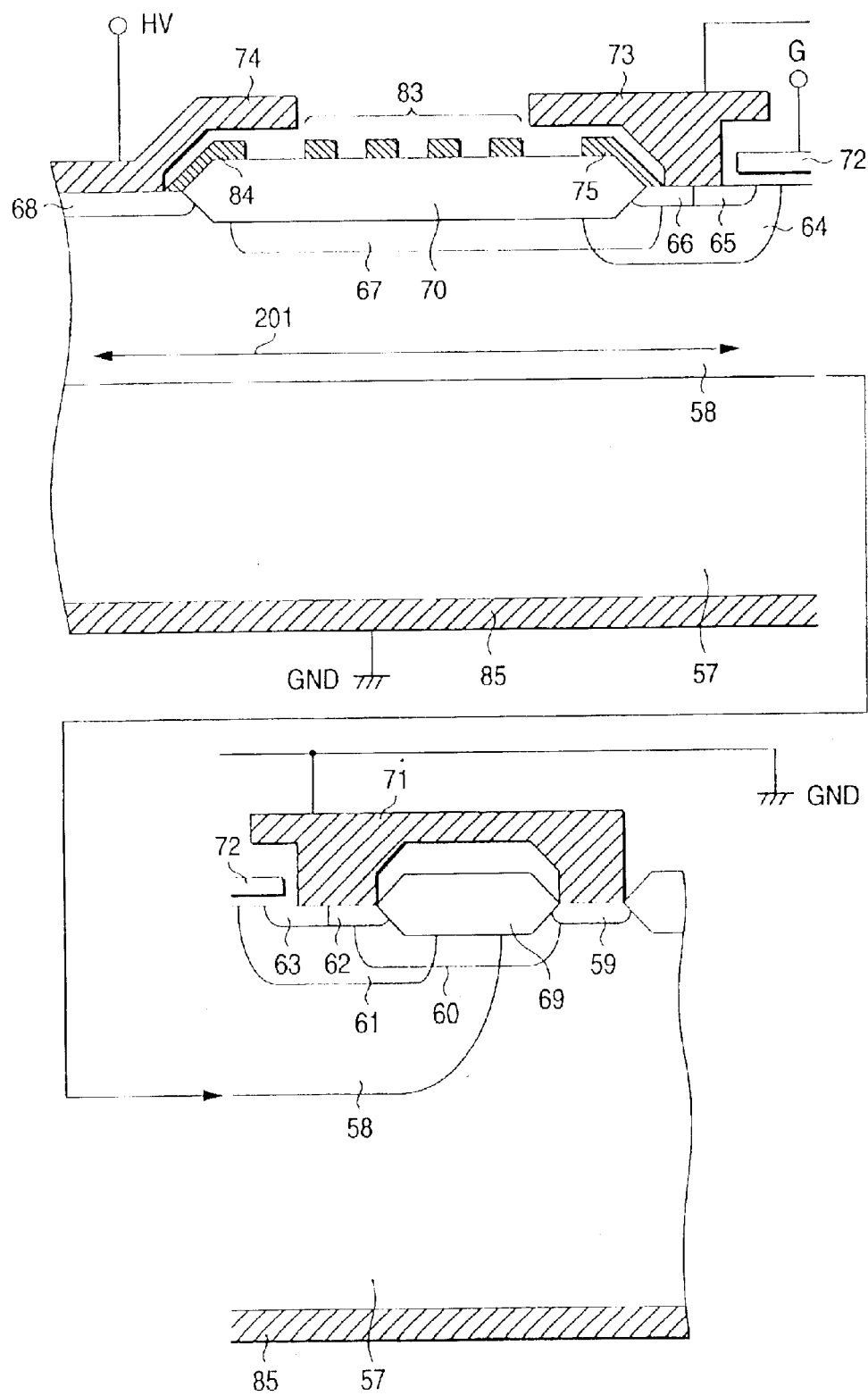
FIG. 8 is a sectional view of the main part of a semiconductor device according to a sixth embodiment of the invention.

FIG. 8 is a sectional view of the semiconductor device according to a sixth embodiment of the invention. This embodiment is an application of the voltage withstanding structure according the first embodiment to a high withstand voltage horizontal-type NMOS (n-channel MOSFET).

As shown, an N-well region 58 is formed in a p-type substrate 57, and in the surface layer thereof, a p⁻ region 60 and a P-offset region 67 are formed. P-well regions 61 and 64 are also formed. Next, LOCOS's (Local Oxidation of Silicon) which are dielectric oxide films 69 and 70 are formed. Further, a gate electrode 72 of polysilicon is formed through a gate oxide film (not shown), and polysilicon films 75, 84 and a spiral thin film layer 83 are formed on the dielectric oxide film 70. The spiral thin film layer 83 is the same as that proposed in the first embodiment. As described previously, it is of course that the spiral thin film layer 83 is composed of a large number of p-n diodes (e.g. Zener diodes).

Next, n⁺ regions 63, 65 serving as a source region and n⁺ region 68 serving as a drain region are formed. Simultaneously, n⁺ regions (not shown) of the spiral thin film layer 83 are also formed. Further, the polysilicon films 75 and 84 which are a field plate are formed as n type low-resistive layers.

In order to make contacts, p⁺ regions 59, 62 and 66 are formed, and p⁺ region (not shown) of the spiral thin film layer 83 is also formed.

The substrate surface is covered with a dielectric film of PSG (phosphorus glass) (not shown). After contact holes are made, source electrodes 71, 73 and a drain electrode 74 are formed, and a rear side electrode 85 is formed on the rear surface.

The high withstand voltage horizontal-type NMOS is structured so that in the "ON" state, an electron flow which is a main current flows from the source side (n⁺ regions 63, 65) to drain side (n⁺ region 68) in an active region 201. Since the spiral thin film layer 83 is formed above the active region 201 through which the main current flows, the potential distribution from the drain side to the source side in a blocked state can be made uniform, thereby improving reliability of the device withstand voltage. In addition, the source-drain distance can be shortened to reduce the "on" resistance and decrease the area occupied by the device.

Figure 9:
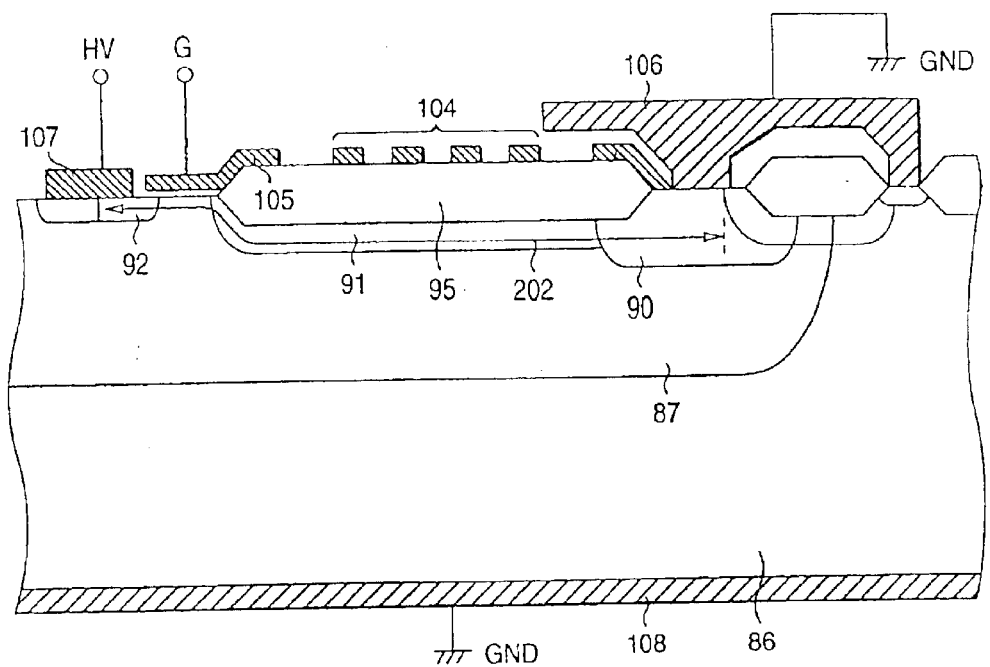
FIG. 9 is a sectional view of the main part of a semiconductor device according to a seventh embodiment of the invention.
Figure 10A:
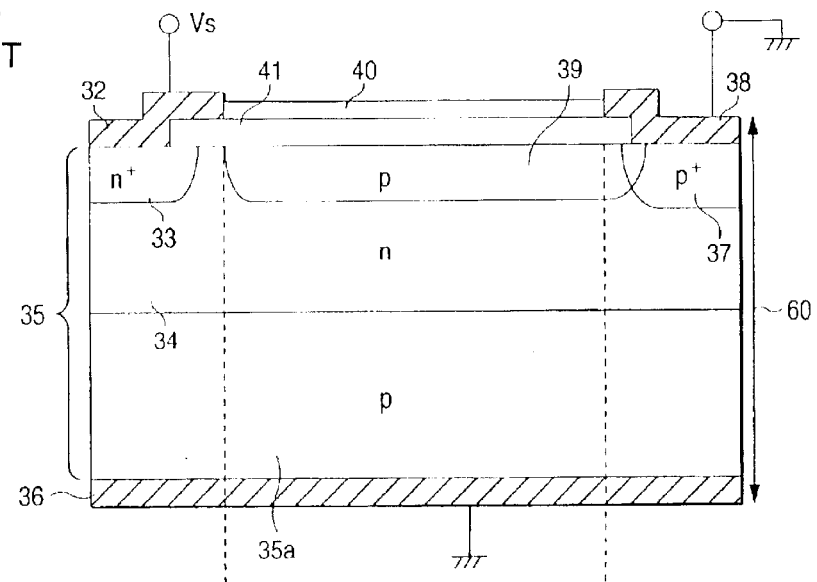
FIG. 10A is a sectional view of the main part showing a composite structure of a Double RESURF structure and a resistive field plate structure of the conventional voltage withstanding structure.
Figure 10B:
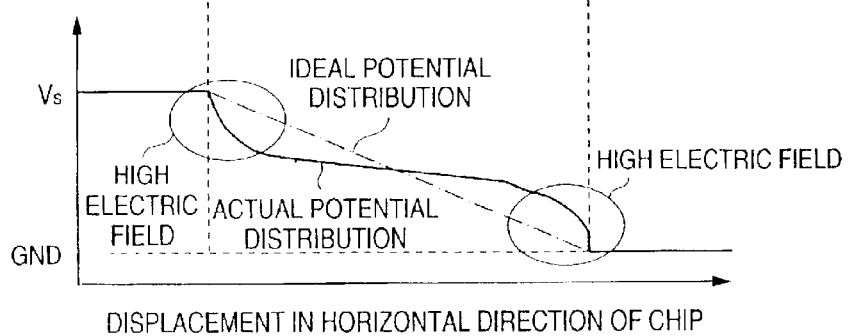
FIG. 10B is a graph showing the potential distribution of the conventional voltage withstanding structure shown in FIG. 10A.
Figure 11:
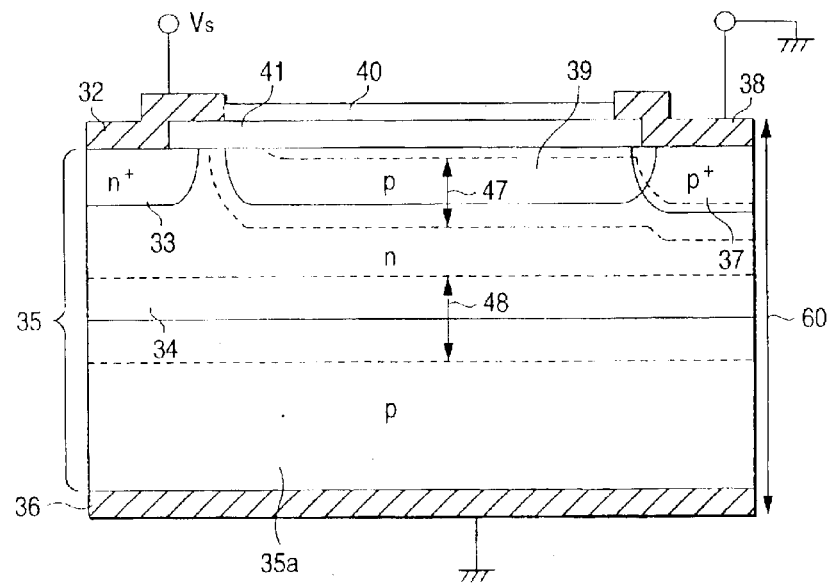
FIG. 11 is a view of enlargement of a depletion layer.
Figure 12:
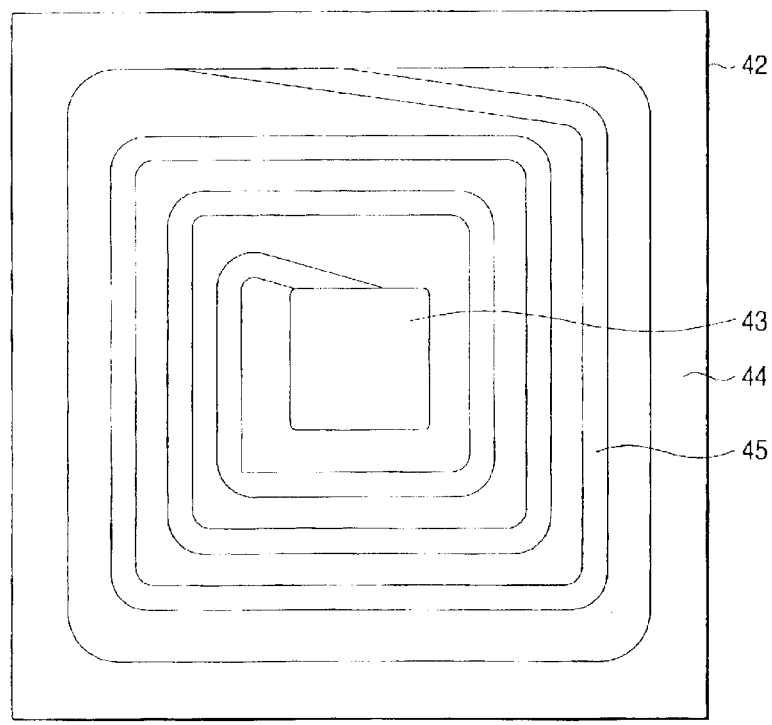
FIG. 12 is a plan view of the main part of a spiral thin film resistive layer 45 in a conventional voltage withstanding structure.

FIG. 9 is a sectional view of the semiconductor device according to a seventh embodiment of the invention. This embodiment is an application of the voltage withstanding structure according the first embodiment to a high withstand voltage horizontal-type PMOS (p-channel MOSFET). Although the structure is not shown in detail, a spiral thin film layer 104 is formed above an active region 202 as in the case of FIG. 8.

As shown in FIG. 9, the P-channel MOS has a semiconductor substrate 86 with a dielectric film layer 95 formed on the semiconductor substrate 86. The references HV, G, and GND indicate a gate electrode 105, a source electrode 106, and a drain electrode 107, respectively, and a rear side electrode 108 is formed on the rear surface of the device. The gate or first electrode 105 and the source or second electrode 106 are separated from each other on the dielectric film 95. The spiral thin film layer 104 is formed on the dielectric film 95 and surrounds the first electrode 105. The spiral thin film layer 104 also and has both ends connected to the first electrode 105 and the second electrode 106, respectively. As described previously, a plurality of p-n diodes (not shown) are formed in series in the spiral thin film layer along a longitudinal direction of the spiral thin film layer. Further, as shown in FIG. 9 and recited in claim 13, a first region 87 of a first conduction type is located in a surface layer of the semiconductor substrate 86. A second region 92 and a third region 90, both of a second conduction type, are separated from each other and are located in a surface layer of the first region 97. A fourth region 91 of the second conduction type is also in the surface layer of the first region 87, but is between the second region 92 and the third region 90. As shown, the fourth region 91 is apart from the second region 92, but comes into contact with the third region 90. The first electrode 105 is formed on one of a surface layer of the second region 92 and a region of the first region 87 between the second region 92 and the third region 90. Meanwhile, the second electrode 106 is connected to the third region 90. Since FIG. 9 shows a P-channel MOS and the first electrode 105 is a gate electrode, the region 87 below the first electrode 105 is a channel region and can be specified as a N-type of the channel region of the P-channel. Accordingly, the second region 92 and the third region 90, which abut to the source electrode 107 and the drain electrode 106, respectively, can be specified as a P-type. Furthermore, since the fourth region 91 is defined in claim 13 to be of the second conductor type, the fourth region 91 can be specified as a P-type. This embodiment can also have the same advantage as in the sixth embodiment.

In accordance with the invention, the spiral thin film layer is turned around an island region externally so as to connect electrically a high potential region and a low potential region to each other, and is constructed of a repetition of Zener diodes. This provides the following effects.

The withstand voltage in the voltage withstanding structure mainly depends on the number of the Zener diodes, and does not greatly depend on the width of the thin film layer.

This permits the width of the spiral thin film layer to be made constant for the chips with the different sizes and with the same withstand voltage. Therefore, where devices with the same withstand voltage are manufactured, the production cost can be greatly reduced as compared with the conventional resistive thin film layer (field plate or spiral resistive thin film layer).

Since the reverse withstand voltage of the Zener is used, the temperature dependency of the withstand voltage of the voltage withstanding structure is small, thereby permitting the withstand voltage to be provided stably.

The polysilicon of the spiral thin film layer is heavily doped with impurities at $1 \times 10^{18}$ cm$^{-3}$ or higher so that the voltage/current characteristic of each of the Zener diodes can be made uniform. This makes the potential gradient uniform from the high potential region to the low potential region, thereby providing a higher withstand voltage.

Provision of a plurality of thin film layers improves reliability for the withstand voltage of the device.

What is claimed is:

1. A semiconductor device comprising:

a semiconductor substrate;

a dielectric film formed on the semiconductor substrate;

a first electrode and a second electrode separated from each other on the dielectric film;

a spiral thin film layer having both ends connected to the first electrode and the second electrode, respectively, the spiral thin film layer surrounding the first electrode, the thin film layer being formed on the dielectric film;

a plurality of p-n diodes formed in series in the spiral thin film layer along a longitudinal direction of the spiral thin film layer;

a first region having a second conduction type in a surface layer of the semiconductor substrate, the first region connected to the first electrode;

a second region having the second conduction type, the second region apart from the first region in the surface layer of the semiconductor substrate, the second region connected to the second electrode; and a third region having the second conduction type, the third region formed in a ring-shape in the surface layer of the semiconductor substrate between the first region and the second region, the third region surrounding the first region; and wherein the semiconductor substrate is of a first conduction type.

2. A semiconductor device comprising:

a semiconductor substrate;

a dielectric film formed on the semiconductor substrate;

a first electrode and a second electrode separated from each other on the dielectric film;

a spiral thin film layer having both ends connected to the first electrode and the second electrode, respectively, the spiral thin film layer surrounding the first electrode, the thin film layer being formed on the dielectric film;

a plurality of p-n diodes formed in series in the spiral thin film layer along a longitudinal direction of the spiral thin film layer;

a first region having a first conduction type in a surface layer of the semiconductor substrate, a second region having a second conduction type in a surface layer of the first region;

a third region having the second conduction type in the surface layer of the first region, the third region apart from the second region; and a fourth region having the second conduction type in the surface layer of the first region between the second region and the third region, the fourth region apart from the second region, the fourth region coming into contact with the third region;

wherein the first electrode is formed on one of a surface layer of the second region and a region on the first region between the second region and the third region, wherein the second electrode is connected to the third region.

3. The semiconductor device as claimed in claim 2, wherein the semiconductor substrate is formed by the second conduction type.

4. A semiconductor device comprising:

a semiconductor substrate;

a dielectric film formed on the semiconductor substrate;

a first electrode and a second electrode separated from each other on the dielectric film;

a spiral thin film layer having both ends connected to the first electrode and the second electrode, respectively, the spiral thin film layer surrounding the first electrode, the thin film layer being formed on the dielectric film;

a plurality of p-n diodes formed in series in the spiral thin film layer along a longitudinal direction of the spiral thin film layer;

a first region having a first conduction type in a surface layer of the semiconductor substrate, a second region having the first conduction type in a surface layer of the first region, the second region connected to the first electrode;

a third region having a second conduction type in the surface layer of the first region, the third region apart from the second region, the third region connected to the second electrode; and a fourth region having the second conduction type in the surface layer of the first region between the second region and the third region, the fourth region apart from the second region, the fourth region coming into contact with the third region;

wherein the semiconductor substrate is formed by the second conduction type.

5. A semiconductor device comprising;

a semiconductor substrate;

a dielectric film formed on the semiconductor substrate;

a first electrode and a second electrode separated from each other on the dielectric film;

a plurality of spiral thin film layers, each spiral thin film layer having both ends connected to the first electrode and the second electrode, respectively, each spiral thin film layer surrounding the first electrode, each spiral thin film layer being formed on the dielectric film; and a plurality of p-n diodes formed in series in each spiral thin film layer along a longitudinal direction of the spiral thin film layer.

* * * * *

UNITED STATES PATENT AND TRADEMARK OFFICE
CERTIFICATE OF CORRECTION

PATENT NO. : 6,828,645 B2
DATED : December 7, 2004
INVENTOR(S) : Jimbo et al.

It is certified that error appears in the above-identified patent and that said Letters Patent is hereby corrected as shown below:

Column 12,
Line 19, after "FIG. 8." please insert -- This embodiment can also have the same advantages as the sixth embodiment. --.
Line 58, please delete "This embodiment can also have the same advantages as the sixth embodiment.".

Signed and Sealed this

Nineteenth Day of April, 2005

JON W. DUDAS
*Director of the United States Patent and Trademark Office*